(12) United States Patent
Chu et al.

(10) Patent No.: US 8,611,138 B1
(45) Date of Patent: Dec. 17, 2013

(54) CIRCUITS AND METHODS FOR HARDENING VOLATILE MEMORY CIRCUITS THROUGH ONE TIME PROGRAMMING

(75) Inventors: Charles Y. Chu, Cupertino, CA (US); Jeffrey Xiaoqi Tung, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 40 days.

(21) Appl. No.: 13/354,740

(22) Filed: Jan. 20, 2012

(51) Int. Cl.
*G11C 11/00* (2006.01)
*G11C 17/00* (2006.01)
*G11C 17/18* (2006.01)

(52) U.S. Cl.
USPC ............. 365/156; 365/96; 365/104; 365/154; 365/225.7

(58) Field of Classification Search
USPC .................................................. 365/104, 156
See application file for complete search history.

(56) References Cited

U.S. PATENT DOCUMENTS

| | | | | |
|---|---|---|---|---|
| 5,426,614 A * | 6/1995 | Harward | .................... | 365/225.7 |
| 6,741,500 B2 * | 5/2004 | DeShazo et al. | ......... | 365/185.28 |
| 6,744,660 B2 * | 6/2004 | Smith et al. | .................... | 365/154 |
| 7,177,182 B2 * | 2/2007 | Diorio et al. | ............. | 365/185.01 |
| 7,242,218 B2 | 7/2007 | Camarota et al. | | |
| 7,471,541 B2 | 12/2008 | Fong et al. | | |
| 7,512,028 B2 | 3/2009 | Archibald et al. | | |
| 7,609,578 B2 * | 10/2009 | Buer et al. | ................. | 365/225.7 |
| 7,626,845 B2 | 12/2009 | Holder, Jr. et al. | | |
| 7,764,532 B2 | 7/2010 | Kurjanowicz et al. | | |
| 7,796,418 B2 * | 9/2010 | Schmitt et al. | ................ | 365/154 |
| 8,159,894 B2 * | 4/2012 | Schmitt et al. | ............. | 365/225.7 |
| 2006/0085615 A1 | 4/2006 | Zhang | | |
| 2008/0294838 A1 | 11/2008 | Houston et al. | | |
| 2009/0251943 A1 | 10/2009 | Kurjanowicz | | |
| 2010/0011266 A1 | 1/2010 | Kurjanowicz | | |
| 2010/0202183 A1 | 8/2010 | Kurjanowicz | | |

* cited by examiner

*Primary Examiner* — Son Mai
(74) *Attorney, Agent, or Firm* — Treyz Law Group; David C. Kellogg (57) ABSTRACT

Circuits and techniques for operating a memory cell on an integrated circuit (IC) are disclosed. A disclosed memory cell includes a first inverter coupled to a second inverter to form a first connection and a second connection. The first connection is operable to receive at least a first data signal at a first voltage and the second connection is operable to receive at least a second data signal at a second voltage. A first oxide capacitor and a second oxide capacitor are coupled to the first and second connections respectively. Both the first and second oxide capacitors are coupled to receive a programming signal at a third voltage that may be operable to rupture either one of the first or second oxide capacitor.

20 Claims, 5 Drawing Sheets

CIRCUITS AND METHODS FOR HARDENING VOLATILE MEMORY CIRCUITS THROUGH ONE TIME PROGRAMMING

BACKGROUND

Programmable circuits (e.g., field-programmable gate array (FPGA) devices) are circuits that can be configured with different designs to perform any of a variety of functions. In order to configure a programmable circuit such as an FPGA, configuration bits are generally read from an external memory module (e.g., a read-only memory (ROM)) to the configuration random access memory (CRAM) module on the programmable circuit.

However, a CRAM module is a volatile memory module that is unable to retain the information once the device or circuit is disconnected from a power source. In other words, the configuration data in the device is lost as soon as the device is powered down. A non-volatile memory is therefore generally preferable as a non-volatile memory is able to retain the configuration data, or any other information stored in the non-volatile memory, even when the device is powered down.

A one-time programmable (OTP) memory module is an example of a non-volatile memory module. Generally, external elements may cause unwanted effects in reconfigurable memory modules. For instance, ionizing radiation may cause the bits stored in the memory cells to flip undesirably. These unwanted changes are typically known as soft errors and one of the more common types of single event upsets (SEUs) that affect programmable circuits.

Compared to a reconfigurable memory module (e.g., a CRAM module), an OTP cell is typically less vulnerable to single even upsets (SEUs) as the OTP cell cannot be reprogrammed or changed in any way once it is programmed. However, a programmable device having only OTP modules, or any other read-only memory (ROM) modules for that matter, may not be desirable as the programmable device can only be configured once.

It would therefore be desirable to provide improved memory circuits for integrated circuits such as programmable devices.

SUMMARY

It may be desirable to have a memory module with volatile memory elements that can be reconfigured and that can be hardened via a one time programming operation, as necessary. It is also desirable to have a memory cell formed with thin oxide transistors that does not occupy a substantial amount of space on the integrated circuit (IC) device.

Embodiments of the present invention include circuits and techniques for operating an IC with a volatile configuration memory cell that may also be used as a one-time programmable memory cell.

It is appreciated that the present invention can be implemented in numerous ways, such as a process, an apparatus, a system, a device or a method on a computer readable medium. Several inventive embodiments of the present invention are described below.

In one embodiment, a memory cell is disclosed. The memory cell includes a first inverter cross-coupled to a second inverter, forming a first connection and a second connection. The first connection is operable to receive at least a first data signal at a first voltage and the second connection is operable to receive at least a second data signal at a second voltage. The memory cell further includes a first oxide capacitor coupled to the first connection and a second oxide capacitor coupled to the second connection. Both the first and second oxide capacitors are coupled to receive a programming signal at a third voltage that is operable to rupture one of the first or second oxide capacitor, during a one time programming operation.

In another embodiment, a one-time programmable memory element is disclosed. The one-time programmable memory element includes first and second, each with at least one input, cross-coupled inverters. The one-time programmable memory element further includes a first transistor with a first terminal coupled to the input of the first inverter. The first transistor is operable to isolate the first terminal from the second terminal prior to a one-time programming event and is operable to form a permanent conductive path between the first terminal and the second terminal after the one-time programming event.

In another embodiment, a method for operating a circuit with a first logic level at a first node and a second logic level at a second node is disclosed. The method includes receiving a signal from an external component at a terminal (e.g., a source-drain terminal) of a first capacitor and a second capacitor. A first difference between the signal and the first logic level is determined and second difference between the signal and the second logic level is determined. The gate of the first capacitor is ruptured (forming a conductive path between the gate and the source-drain terminal of the first capacitor) when the first difference is greater than the second difference while the gate of the second capacitor is ruptured (forming a conductive path between the gate and the source-drain terminal of the second capacitor) when the second difference is greater than the first difference.

Further features of the invention, its nature and various advantages will be more apparent from the accompanying drawings and the following detailed description of the preferred embodiments.

DETAILED DESCRIPTION

The following embodiments include circuits and techniques for operating an integrated circuit (IC) with a configuration memory cell that may be used as a one-time programmable memory cell (e.g., that may be hardened via a one-time programming operation).

It will be obvious, however, to one skilled in the art, that the present exemplary embodiments may be practiced without some or all of these specific details. In other instances, well-known operations have not been described in detail in order not to unnecessarily obscure the present embodiments.

Generally, a programmable logic device (PLD) (e.g., a field programmable gate array (FPGA) device) may be configured through configuration random access memory (CRAM) bits. However, a CRAM module is a volatile memory module and as such is not able to retain the configuration data once the device is powered down. It is therefore preferable to have a CRAM module, or a volatile memory module, that is capable of becoming a non-volatile memory module once the device is configured (and, optionally, after the device is tested). As the configuration data can be stored in the device even when the device is powered down, there will be no need for the device to be reconfigured with an external memory module when the device is powered up again. The embodiments described herein provide techniques and circuits that enable a volatile memory cell to be converted to a non-volatile memory cell. One of the embodiments describes a memory cell that can function as a volatile memory cell before configuration and the same memory cell may be converted to a non-volatile memory cell after configuration. In an exemplary embodiment, the memory cell is converted to a one-time programmable memory cell that is less susceptible to, and potentially immune to, single event upset (SEU) memory faults.

Figure 1:
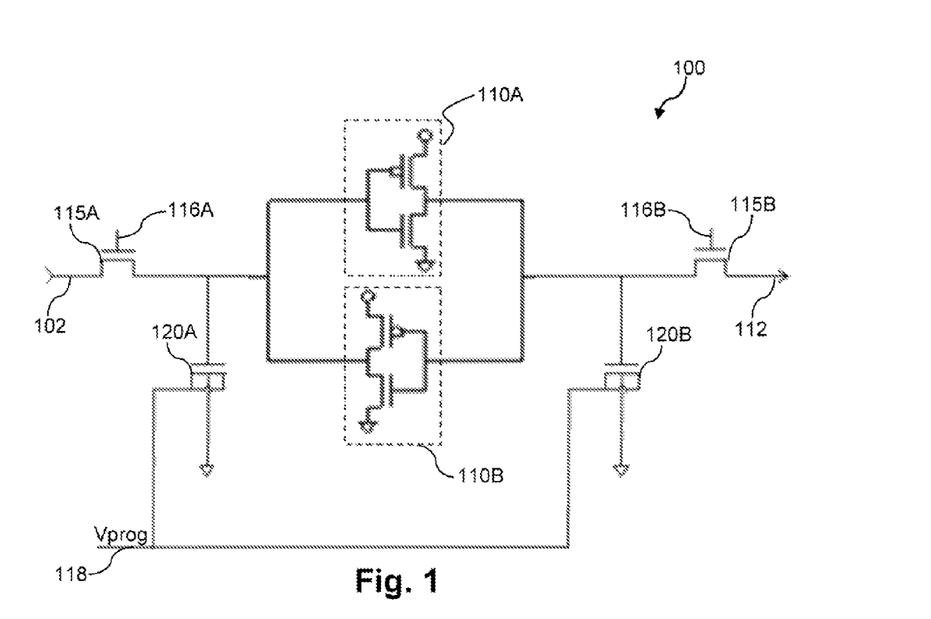
FIG. 1 is a schematic diagram of an illustrative volatile memory circuit that may include circuits that harden the memory cell in a one time programming operation in accordance with an embodiment of the present invention.

FIG. 1, meant to be illustrative and not limiting, shows a memory cell circuit 100 as one embodiment in accordance with the present invention. Memory cell circuit 100 is formed by two pairs of back-to-back or cross coupled transistors. Each pair of the transistors includes a P-channel transistor coupled to an N-channel transistor. It should be appreciated that the cross-coupled transistors form two cross-coupled inverters 110A and 110B. An input terminal 102 is coupled to a first side of inverters 110A and 110B and an output terminal 112 is coupled to a second side of inverters 110A and 110B. If desired, terminal 102 may be an output terminal and terminal 112 may be an input terminal. Transistor 115A is coupled between the input terminal 102 and the first side of the cross-coupled inverters 110A and 110B. Another transistor, transistor 115B, is coupled between the output terminal 112 and the second side of the cross-coupled inverters 110A and 110B. In one embodiment, the gate terminals 116A and 116B of each of the transistors 115A and 115B are coupled to receive a control signal from a memory controller circuit. It should be appreciated that when a value is being written to memory cell circuit 100, the memory controller circuit may enable transistor 115A in order to allow the value to be written to memory cell circuit 100. Transistor 115A may be turned off after the value has been stored in memory cell circuit 100.

When the stored value is to be read from memory cell circuit 100, the memory controller circuit may enable transistor 115B and the stored value may be transmitted from memory cell circuit 100 through output terminal 112. If desired, transistor 115B may be omitted and the output of inverter 110A may be directly connected to output 112 of memory element 110. This type of arrangement may be used, as an example, when memory element 110 is a configuration memory element that provides static control signals in a programmable logic device.

Referring still to FIG. 1, an oxide capacitor 120A is coupled between transistor 115A and the first side of the cross-coupled inverters 110A and 110B, while another oxide capacitor 120B is coupled between transistor 115B and the second side of the cross-coupled inverters 110A and 110B. A body terminal of each of the oxide capacitors 120A and 120B is coupled to a power source (e.g., VSS) while a source-drain terminal is coupled to receive a programming voltage Vprog on programming line 118. In one embodiment, memory cell circuit 100 is an embedded memory cell on a programmable device and Vprog may be a voltage level that is provided internally on the programmable device. Vprog may also be a voltage level provided through a charge pump circuit within the programmable device or a voltage value that is routed in from an external component connected to the device. In one embodiment, depending on the voltage level of Vprog and the value stored in memory cell circuit 100, the gate of one of the oxide capacitors 120A or 120B may be ruptured.

Figure 2:
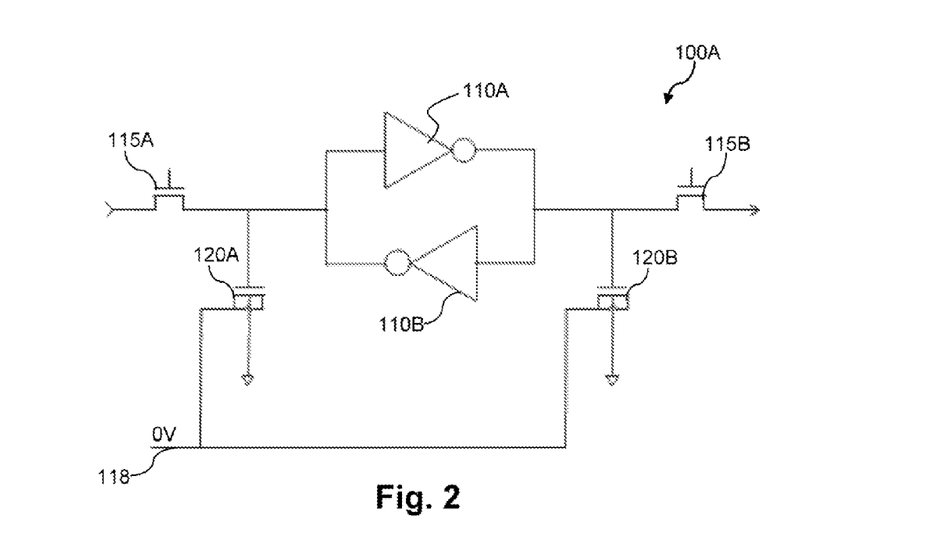
FIG. 2 is a schematic diagram of the illustrative volatile memory circuit of FIG. 1 receiving a low programming voltage Vprog voltage in accordance with an embodiment of the present invention.

FIG. 2, meant to be illustrative and not limiting, shows memory cell circuit 100A receiving a low Vprog voltage as one embodiment in accordance with the present invention. In one embodiment, transistors 115A and 115B and oxide capacitors 120A and 120B are thin oxide devices. In another embodiment, transistors 115A and 115B have a higher gate oxide rupture voltage compared to oxide capacitors 120A and 120B. Therefore, the gate of either one of oxide capacitors 120A and 120B will rupture before the junction of transistors 115A and 115B. When programming line 118 is coupled to a low voltage level (e.g., 0V) memory cell circuit 100A may act as a CRAM cell. In the embodiment of FIG. 2, memory cell circuit 100A may be reconfigured multiple times when Vprog is at 0V (e.g., memory cell circuit 100A may operate as a volatile memory cell). It should be appreciated that memory cell circuit 100A may represent one bit of a memory module and more memory cell circuits similar to memory cell circuit 100A may be coupled together to form a memory module on a programmable circuit.

Figure 3A:
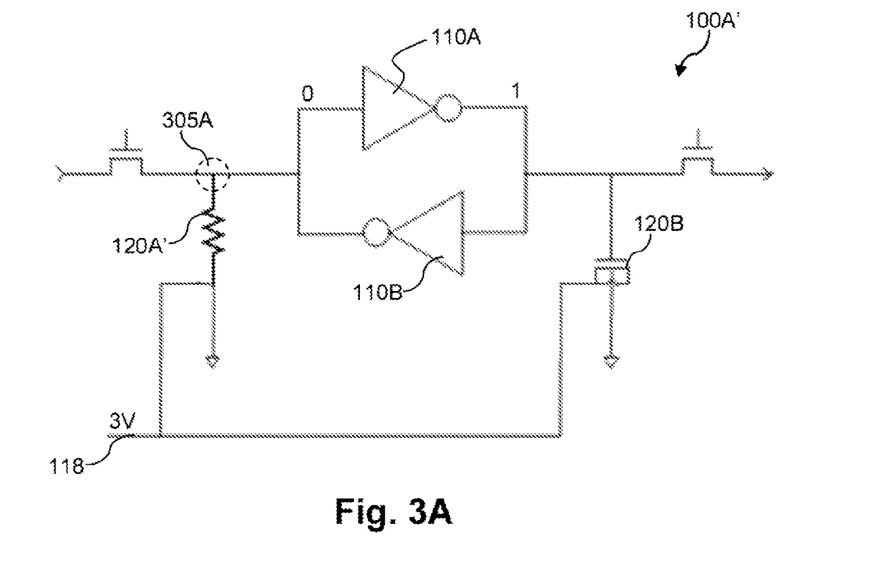
FIG. 3A is a schematic diagram of the illustrative memory circuit of FIG. 1 configured with a logic high value and receiving a high programming voltage Vprog voltage value during a one time programming operation in accordance with an embodiment of the present invention.

FIG. 3A, meant to be illustrative and not limiting, shows memory cell circuit 100A' configured with a logic high value and receiving a high Vprog voltage value as one embodiment in accordance with the present invention. In the embodiment of FIG. 3A, when storing a logic high value, a logic low value, 0, is written to the first side of cross-coupled inverters 110A and 110B and a logic high value, 1, is written to the second side of the cross-coupled inverters 110A and 110B. In an exemplary embodiment, memory cell circuit 100A' may be configured multiple times when Vprog is at 0V, as shown in the embodiment of FIG. 2. After memory cell 100A' has been configured with the desired value, Vprog may be raised to a higher voltage level (e.g., 3V), as shown in FIG. 3A (and FIG. 4A).

As the first side of the cross-coupled inverters 110A and 110B is at a low voltage level, 0V, according to the embodiment of FIG. 3A, the voltage difference between oxide capacitor 120A of FIG. 2 and the first side of the cross-coupled inverters 110A and 110B, which is 3V (3V−0V), is greater than the voltage difference between oxide capacitor 120B and the second side of the cross-coupled inverters 110A and 110B, which is 2V (3V−1V). In one embodiment, the higher voltage across capacitor 120A may rupture the gate oxide of capacitor 120A. It should be appreciated that due to the presence of inverters 110A and 110B, one side of memory cell circuit 100A' will store a complementary logic value to the other side and as such, only one oxide capacitor, either oxide capacitor 120A or 120B, will experience a voltage difference across its gate and source-drain terminals large enough to rupture its gate oxide. In one embodiment, the gate of either of oxide capacitors 120A or 120B may be ruptured with a voltage of 3V and greater. In an exemplary embodiment, once the gate of the oxide capacitor 120A is ruptured, the oxide capacitor 120A will act as a resistor 120A' between node 305A and programming line 118, which will pull node 305A to a low voltage level (e.g., ground) during normal operations (e.g., when Vprog is at a low voltage level). In one embodiment, when node 305A is pulled to a logic low level, the corresponding side, i.e., the first side, of the cross-coupled inverters 110A and 110B is consequently pulled to a low voltage level.

Figure 3B:
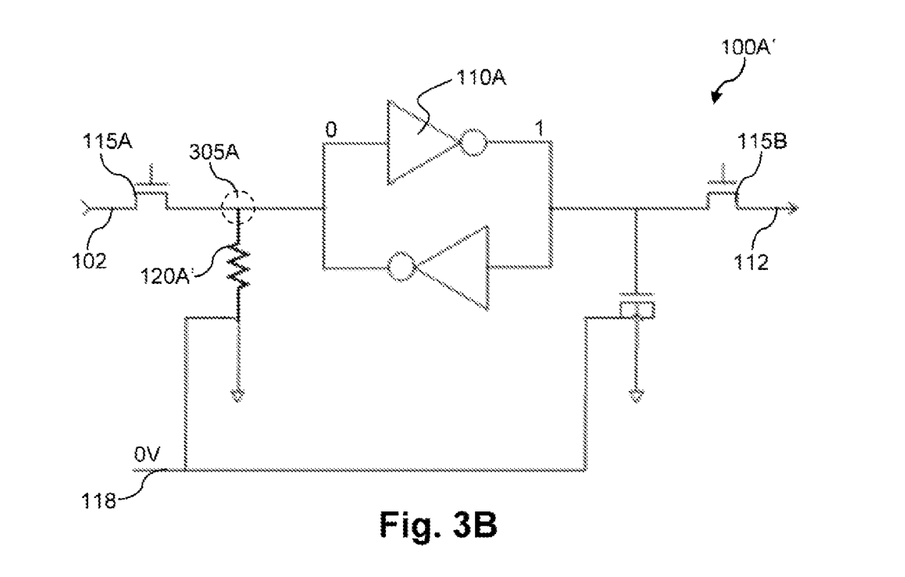
FIG. 3B is a schematic diagram of the illustrative memory circuit of FIG. 3A with a logic high value after the one time programming operation in accordance with an embodiment of the present invention.

FIG. 3B, meant to be illustrative and not limiting, shows memory cell circuit 100A' with a logic high value after configuration as one embodiment in accordance with the present invention. After memory cell circuit 100A' has been configured, a low voltage level, 0V, is coupled to on programming line 118. In one embodiment, after the ruptured oxide capacitor acts as a resistor 120A' to pull node 305A to a low logic level and turns memory cell circuit 100A' into a non-volatile memory cell. In an exemplary embodiment, memory cell circuit 100A' is a one-time programmable (OTP) memory cell (which has already been subjected to a one time programming operation) after the gate of the oxide capacitor 120A of FIG. 2 has been ruptured. At this juncture, even though transistor 115A may be enabled and a new logic value may be transmitted to memory cell circuit 100A' through input 102, resistor 120A' will continue to pull node 305A to a logic low level. Therefore, the first side of cross-coupled inverters 110A and 110B will remain at a logic low level. Consequently, when transistor 115B is enabled, due to the presence of inverter 110A, a logic high level will be transmitted from memory cell circuit 100A' through output 112.

Figure 4A:
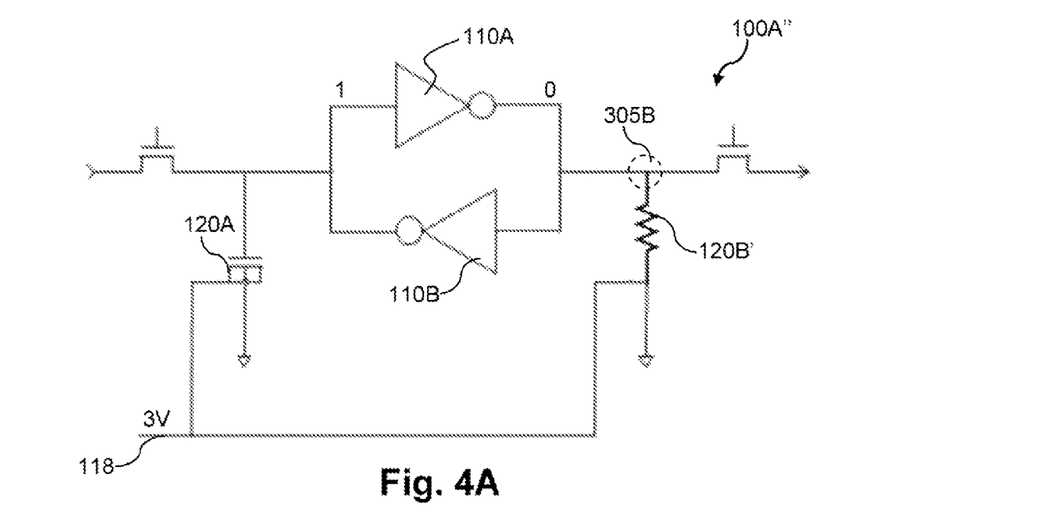
FIG. 4A is a schematic diagram of the illustrative memory circuit of FIG. 1 configured with a logic low value and receiving a high programming voltage Vprog voltage value during a one time programming operation in accordance with an embodiment of the present invention.

FIG. 4A, meant to be illustrative and not limiting, shows memory cell circuit 100A" configured with a logic low value and receiving a high Vprog voltage value, 3V, as one embodiment in accordance with the present invention. In the embodiment of FIG. 4A, when storing a logic low value, a logic high value, 1, is written to the first side of cross-coupled inverters 110A and 110B and a logic low value, 0, is written to the second side of cross-coupled inverters 110A and 110B. It should be appreciated that a logic high level is approximately equivalent to a voltage high level and a logic low level is approximately equivalent to a voltage low level in this context. As the first side of the cross-coupled inverters 110A and 110B is at a high voltage level, 1V, according to the embodiment of FIG. 4A, the voltage difference between oxide capacitor 120A and the first side of the cross-coupled inverters 110A and 110B, which is 2V (3V−1V), is greater than the voltage difference between oxide capacitor 120B of FIG. 2 and the second side of the cross-coupled inverters 110A and 110B, which is 3V (3V−0V). In one embodiment, the higher voltage across capacitor 120B may rupture the gate oxide of capacitor 120B. In an exemplary embodiment, once the gate of the oxide capacitor 120B is ruptured, the oxide capacitor 120B will act as a resistor 120B' (e.g., between node 305B and programming line 118) to pull node 305B to a low voltage level (e.g., ground). In one embodiment, when node 305B is pulled to a logic low level, the corresponding side, i.e., the second side, of the cross-coupled inverters 110A and 110B is consequently pulled to a low voltage level.

Figure 4B:
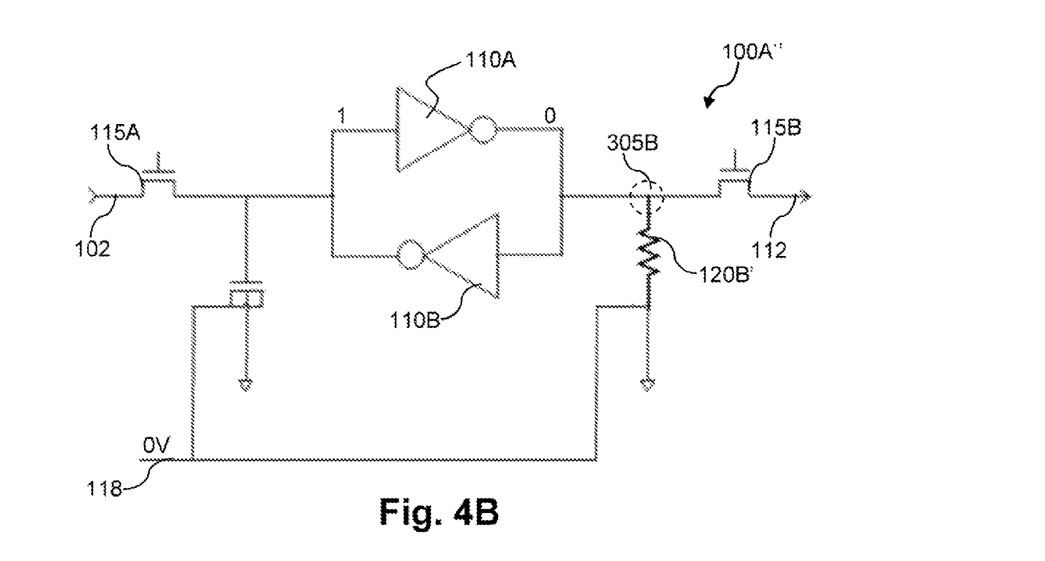
FIG. 4B is a schematic diagram of the illustrative memory circuit of FIG. 4A with a logic low value after the one time programming operation as in accordance with an embodiment of the present invention.

FIG. 4B, meant to be illustrative and not limiting, shows memory cell 100A" with a logic low value after configuration as one embodiment in accordance with the present invention. In the embodiment of FIG. 4B, Vprog is lowered to a low voltage level, 0V, after memory cell 100A" has been configured. At this juncture, even though transistor 115A may be enabled and a new logic value may be transmitted to memory cell circuit 100A" through input 102, resistor 120B' will continue to pull node 305B to a logic low level. As such, the second side of cross-coupled inverters 110A and 110B will remain at a logic low level. Consequently, when transistor 115B is enabled, a logic low level will be transmitted from memory cell circuit 100A" through output 112. In one embodiment, memory cell circuit 100A" and memory cell circuit 100A' of FIGS. 3A and 3B may each represent a single bit cell storing a one bit value. It should be appreciated that similar memory cells may be coupled together to form a memory module storing configuration data.

Figure 5:
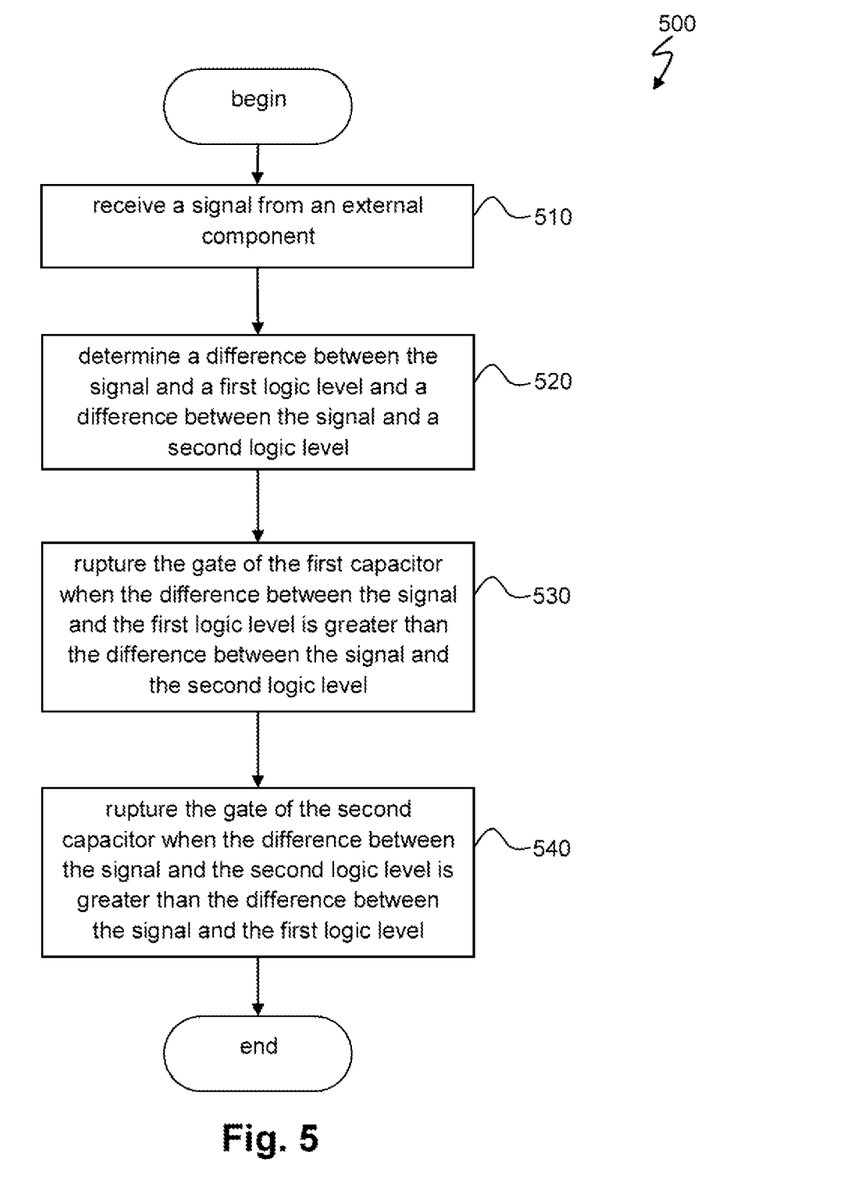
FIG. 5 shows illustrative steps involved in operating hardening a volatile memory element such as the memory circuit of FIG. 1 in a one time programming operation in accordance with an embodiment of the present invention.

FIG. 5, meant to be illustrative and not limiting, shows illustrative steps in method flow 500 for operating a circuit as one embodiment in accordance with the present invention. The circuit may hold a first logic level at a first side and a second logic level at a second side. Flow 500 begins by receiving a signal at step 510. In an exemplary embodiment, the circuit is a memory cell circuit similar to memory cell circuit 100 of FIG. 1. The signal is received at a gate of a first capacitor and a gate of a second capacitor. In an exemplary embodiment, the signal received at step 500 is a voltage level. A difference between the signal and the first logic level (at the first side of the circuit) and a difference between the signal and the second logic level (at the second side of the circuit) are determined at step 520. The gate of the first capacitor is ruptured at step 530 when the difference between the received signal and the first logic level is greater than the difference between the same signal and the second logic level. If the difference between the received signal and the second logic level is greater than the difference between the received signal and the first logic level, the gate of the second capacitor is ruptured at step 540. In one embodiment, the circuit may be a volatile memory cell prior to the rupturing of the gate of either one of the first or second capacitor and the rupturing of the gate of either the first or second capacitor may convert the volatile memory cell into a one-time programmable memory cell (which is programmed according to which one of the first and second capacitors was ruptured).

Figure 6:
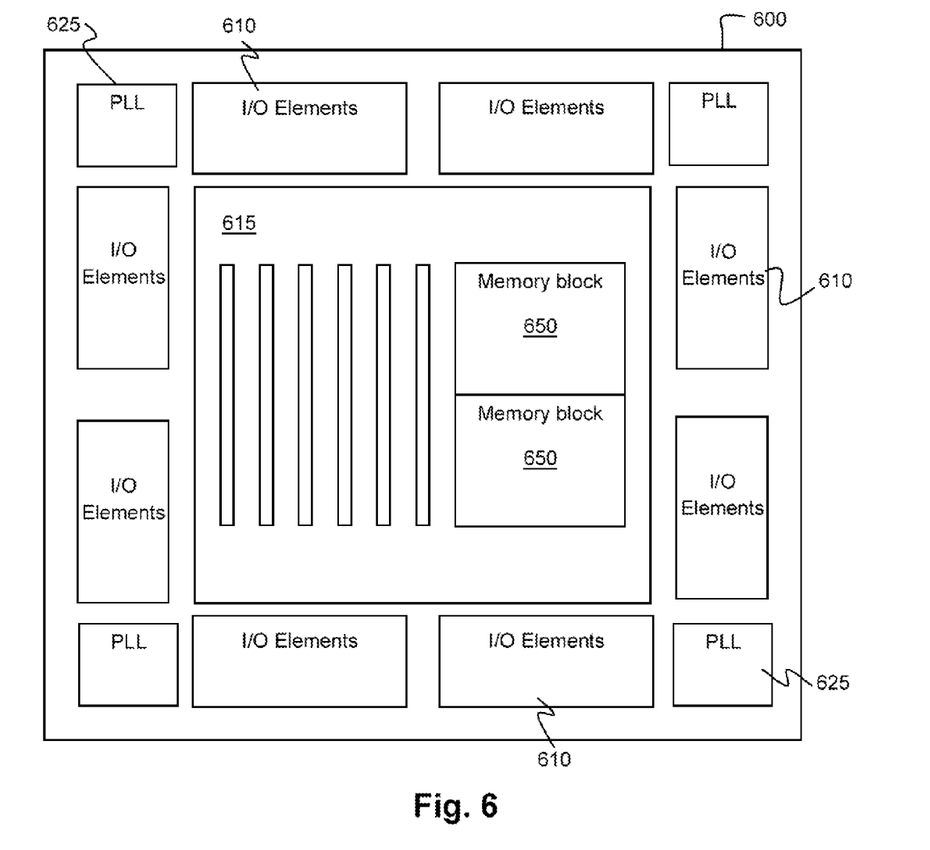
FIG. 6 is a simplified block diagram of an integrated circuit (IC) that may include voltage memory elements that may be programmed (e.g., hardened) via one time programming operations in accordance with an embodiment of the present invention.

FIG. 6, meant to be illustrative and not limiting, shows a simplified block diagram of IC 600 that can implement embodiments of the present invention. IC 600 includes core logic region 615 and input-output (I/O) elements 610. Other auxiliary circuits such as phase-locked loops (PLLs) 625 for clock generation and timing, can be located outside the core logic region 615 (e.g., at corners of IC 600 and adjacent to I/O elements 610).

Core logic region 615 may be populated with logic cells which include, among other things, at a basic level, "logic elements" (LEs). LEs may include look-up table-based logic regions and may be grouped into "Logic Array Blocks" (LABs). The LEs and groups of LEs or LABs can be configured to perform logical functions desired by the user. Core logic region 615 may also include a plurality of embedded memory blocks 650 that can be used to perform a variety of functions. In one embodiment, memory blocks 650 may include configuration memory blocks formed by multiple memory cells similar to memory cell circuit 100 of FIG. 1.

The configuration memory blocks in memory blocks 650 may be used to store configuration information that is used to program IC 600. The configuration memory blocks, formed by multiple memory cell circuits 100 of FIG. 1, may be configured such that only a selected portion, i.e., selected pages, of the configuration memory is programmed at any one time. As such, different portions of the configuration memory may be converted to non-volatile memory blocks as desired.

Referring still to FIG. 6, I/O elements 610 may support a variety of interface protocols. I/O elements 610 may support a variety of single-ended and differential I/O standards. I/O elements 610 may also include I/O buffers that connect IC 600 to other external components. Signals from core region 615 are transmitted through I/O elements 610 to external components that may be connected to IC 600. IC 600 receives signals from external circuitry at I/O elements 610. Core logic region 115 and other logic blocks on IC 600 perform the appropriate function based on the signals received. Signals are sent from core logic region 615 and other relevant logic blocks of IC 600 to other external circuitry or components that may be connected to IC 600 through I/O elements 610.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A memory cell comprising:
    a first inverter cross-coupled to a second inverter forming a first connection and a second connection, wherein the first connection is operable to receive at least a first data signal at a first voltage, and wherein the second connection is operable to receive at least a second data signal at a second voltage;
    a first oxide capacitor coupled to the first connection; and
    a second oxide capacitor coupled to the second connection, wherein the first and second oxide capacitors are further coupled to receive a programming signal at a third voltage, wherein the programming signal is operable to rupture a selected one of the first oxide capacitor and the second oxide capacitor.

2. The memory cell of claim 1, wherein the selected one of the first oxide capacitor and the second oxide capacitor that is ruptured is selected based on a difference between the third voltage and the first voltage and a difference between the third voltage and the second voltage.

3. The memory cell of claim 1, wherein the first voltage is associated with a first logic level and wherein the second voltage is associated with a second logic level.

4. The memory cell of claim 1, wherein the programming signal is operable to rupture the selected one of the first oxide capacitor and the second oxide capacitor to transform the memory cell from a volatile memory element to a permanently programmed element.

5. A one-time programmable memory element, comprising:
    first and second cross-coupled inverters, wherein each of the first and second inverters has at least one input; and
    a first transistor having a first terminal coupled to the input of the first inverter and having a second terminal, wherein:
        prior to a one-time programming event, the first transistor is operable to isolate its first terminal from its second terminal;
        after the one-time programming event, the first transistor comprises a permanent conductive path between its first terminal and its second terminal;
        the first terminal of the first transistor comprises a gate terminal;
        the second terminal of the first transistor comprises a source-drain terminal;
        during the one-time programming event, the first transistor is operable to receive a ground power supply voltage at its gate terminal and is operable to receive a programming voltage at its source-drain terminal; and
        a voltage difference between the programming voltage received by the first transistor and the ground power supply voltage is operable to rupture gate oxide in the first transistor.

6. The one-time programmable memory element defined in claim 5, wherein the one-time programmable memory element is operable as a volatile memory element prior to the one-time programming event and is operable as a permanently programmed element after the one-time programming event, the one-time programmable memory element further comprising:
a first memory element transistor operable to load data into the first and second inverters when the one-time programmable memory element is operable as a volatile memory element prior to the one-time programming event.

7. The one-time programmable memory element defined in claim 6 further comprising:
a second memory element transistor operable to transmit data from the first and second inverters both when the one-time programmable memory element is operable as a volatile memory element prior to the one-time programming event and when the one-time programmable memory element is operable as a permanently programmed element after the one-time programming event.

8. The one-time programmable memory element defined in claim 5 further comprising:
a second transistor having a first terminal coupled to the input of the second inverter and having a second terminal, wherein, both prior to the one-time programming event and after the one-time programming event, the second transistor is operable to isolate its first terminal from its second terminal.

9. The one-time programmable memory element defined in claim 8 wherein the first terminal of the second transistor comprises a gate terminal, wherein the second terminal of the second transistor comprises a source-drain terminal, and wherein the permanent conductive path comprises ruptured gate oxide.

10. The one-time programmable memory element defined in claim 9 wherein, prior to the one-time programming event, the first and second transistors are each operable to receive a ground power supply voltage at their respective source-drain terminals.

11. A one-time programmable memory element, comprising:
first and second cross-coupled inverters, wherein each of the first and second inverters has at least one input;
a first transistor having a first terminal coupled to the input of the first inverter and having a second terminal, wherein, prior to a one-time programming event, the first transistor is operable to isolate its first terminal from its second terminal and wherein, after the one-time programming event, the first transistor comprises a permanent conductive path between its first terminal and its second terminal; and
a second transistor having a first terminal coupled to the input of the second inverter and having a second terminal, wherein:
both prior to the one-time programming event and after the one-time programming event, the second transistor is operable to isolate its first terminal from its second terminal;
the first terminals of the first and second transistors comprise respective gate terminals;
the second terminals of the first and second transistors comprise respective source-drain terminals;
the permanent conductive path comprises ruptured gate oxide;
prior to the one-time programming event, the first and second transistors are each operable to receive a ground power supply voltage at their respective source-drain terminals;
during the one-time programming event, the first transistor is operable to receive the ground power supply voltage at its gate terminal and is operable to receive a programming voltage at its source-drain terminal; and
a voltage difference between the programming voltage received by the first transistor and the ground power supply voltage is operable to rupture gate oxide in the first transistor.

12. The one-time programmable memory element defined in claim 11 wherein, during the one-time programming event, the second transistor is operable to receive a positive power supply voltage at its gate terminal and is operable to receive the programming voltage at its source-drain terminal and wherein, a voltage different between the programming voltage received by the second transistor and the positive power supply voltage is insufficient to rupture gate oxide in the second transistor.

13. The one-time programmable memory element defined in claim 12 wherein, after the one-time programming event, the first transistor and second transistors are operable to receive the ground power supply voltage and their respective source-drain terminals, and wherein the first transistor is operable to permanently pull down the input of the first inverter to the ground power supply voltage.

14. A method of operating a circuit having a first logic level at a first node and a second logic level at a second node comprising:
receiving a signal from an external component at a gate of a first capacitor and a gate of a second capacitor;
determining a first difference between the signal and the first logic level and a second difference between the signal and the second logic level;
rupturing the gate of the first capacitor when the first difference is greater than the second difference; and
rupturing the gate of the second capacitor when the second difference is greater than the first difference.

15. The method of claim 14, wherein the circuit is a volatile memory circuit, and wherein the rupturing of the gate of the one of the first capacitor and the second capacitor transforms the volatile memory circuit to a non-volatile memory circuit.

16. The method of claim 14, wherein the signal is a positive voltage level.

17. The method of claim 14 further comprising:
receiving a logic level;
storing the logic level at the first node prior to the rupturing; and
storing an inverted version of the logic level at the second node prior to the rupturing.

18. The method of claim 14, wherein the circuit is a memory cell on a programmable logic device.

19. The method of claim 18, wherein the external component is a memory controller circuit on the programmable logic device.

20. The method of claim 14 further comprising:
receiving another signal from the external component after the gate of one of the first capacitor and the second capacitor is ruptured.

* * * * *